US006630281B2

(12) United States Patent
Koh et al.

(10) Patent No.: US 6,630,281 B2
(45) Date of Patent: Oct. 7, 2003

(54) PHOTORESIST COMPOSITION FOR TOP-SURFACE IMAGING PROCESSES BY SILYLATION

(75) Inventors: Cha Won Koh, Seoul (KR); Geun Su Lee, Kyoungki-do (KR); Ki Ho Baik, Kyoungki-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/902,152

(22) Filed: Jul. 10, 2001

(65) Prior Publication Data

US 2002/0031721 A1 Mar. 14, 2002

(30) Foreign Application Priority Data

Jul. 13, 2000 (KR) ........................ 2000-40084

(51) Int. Cl.[7] .................. G03F 7/038; G03F 7/40; G03F 7/38; G03F 7/20
(52) U.S. Cl. .................. 430/270.1; 430/905; 430/909; 430/927
(58) Field of Search .............. 430/270.1, 927, 430/909, 905

(56) References Cited

U.S. PATENT DOCUMENTS

| | | | | |
|---|---|---|---|---|
| 5,958,648 A | * | 9/1999 | Nishimura et al. | 430/270.1 |
| 6,140,010 A | * | 10/2000 | Iwasa et al. | 430/270.1 |
| 6,312,868 B1 | * | 11/2001 | Kong et al. | 430/270.1 |
| 6,451,499 B1 | * | 9/2002 | Jayaraman et al. | 430/270.1 |
| 2002/0048723 A1 | * | 4/2002 | Lee et al. | 430/270.1 |

* cited by examiner

Primary Examiner—Janet Baxter
Assistant Examiner—Yvette C. Thornton
(74) Attorney, Agent, or Firm—Marshall, Gerstein & Borun

(57) ABSTRACT

Photoresist compositions for a Top-surface Imaging Process by Silylation (TIPS), and a process for forming a positive pattern according to the TIPS using the same. The photoresist composition for the TIPS comprises a cross-linker of following Formula 1 or 2. A protecting group of the cross-linker and a hydroxyl group of the photoresist polymer are selectively crosslinked in the exposed region, and the residual hydroxyl group reacts to a silylating agent in the non-exposed region by silylation. Thus, the non-exposed region only remains after the dry-development, thereby forming a positive pattern. In addition, the photoresist composition of the present invention is suitable for the TIPS lithography using light sources such as ArF (193 nm), VUV (157 nm) and EUV (13 nm).

Formula 1

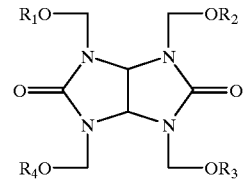

Formula 2

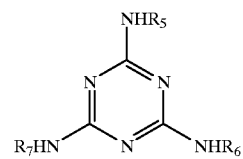

wherein, $R_1$, $R_2$, $R_3$, $R_4$, $R_5$, $R_6$ and $R_7$ are as defined in the specification.

10 Claims, 1 Drawing Sheet

PHOTORESIST COMPOSITION FOR TOP-SURFACE IMAGING PROCESSES BY SILYLATION

BACKGROUND

1. Technical Field

Photoresist compositions are disclosed for top-surface imaging processes by silylation (TIPS). In particular, photoresist compositions are disclosed which are useful in TIPS, by crosslinking a protecting group of a cross-linker and a hydroxyl group of a photoresist polymer in an exposed region, and by reacting the hydroxyl group and a silylating agent in a non-exposed region.

2. Description of the Background Art

Recently, the chemical amplification of type DUV photoresists have been investigated in order to achieve high sensitivity in minute image formation processes for preparing semiconductor devices. In general, a useful photoresist for ArF, VUV, EUV and E-beam has a variety of desired characteristics, such as high transmissibility at the wavelength of each light source, high etching resistance, and high adhesiveness to a wafer. In addition, the photoresist should be easy to develop in readily available developing solutions, such as 2.38wt % and 2.6wt % aqueous tetramethylammonium hydroxide (TMAH) solutions.

Research has been performed on resins having a high transparency at a wavelength of 193 nm and dry etching resistance similar to Nobolac™ resin. However, most of the photoresists are not suitable for VUV due to their poor transmittance at the 157 nm wavelength. While photoresists containing fluorine and silicon have good transmittance at these wavelengths, most photoresists containing fluorine with a polyethylene or polyacrylate polymer backbone have weak etching resistance, low solubility in an aqueous TMAH solution and poor adhesiveness to the silicon wafer. In addition, these photoresists are difficult to mass-produce and are expensive. Furthermore, during a post-exposure bake (PEB) process these photoresists can generate HF which can contaminate a lens or corrode a device. Thus, these photoresists are generally not suitable for commercial use. On the other hand, photoresists containing silicon should satisfy required silicon content (over 10%) in the etching step. For this, monomers comprising silicon are used in a large volume, which increases hydrophobicity of the photoresist. Therefore, the photoresist cannot satisfy selectivity between the exposed region and the non-exposed region in the aqueous TMAH solution, and, as a result, has low adhesiveness to the silicon wafer.

Some of the known limitations of the photolithography include substrate's influence on light (e.g., reflection, scattering, diffraction, etc.), notching, standing wave effect, pattern collapse, non-uniformity of a critical dimension (CD), isolated and grouped bias (IG bias) and the like.

On the other hand, thin layer imaging technologies such as TIPS are effective patterning processes for photolithography using a wavelength below 193 nm and optical lithography using an extreme ultraviolet (EUV) wavelength (e.g., 13 nm).

In TIPS, a shallow exposure is performed which forms a latent image by diffusion of acids that are generated in the exposed region. The exposed region is then selectively silylated with a silylating agent. The silylated region serves as a mask, and the non-silylated region is dry-etched by $O_2$ plasma. Thus, TIPS requires photoresist compositions having a high energy absorption coefficient and process conditions that have high selectivity in etching non-silylated regions during the $O_2$ plasma treatment.

TIPS is rarely influenced by substrates and topology. In addition, TIPS is less sensitive to transparency, adhesiveness and etching selection ratio of the photoresist composition. TIPS also has a much wider depth of focus in high resolution than a single layer resist (SLR). Thus, in some aspects, TIPS has more advantages than a general resist patterning process.

In addition, as compared with a wet development of SLR, the dry development process of TIPS can be applied to a thick resist process in a high aspect ratio without causing a pattern to collapse. This advantage is useful on a substrate having a relatively low etching selection ratio, such as an oxide or metal. As a result, TIPS is recognized as an alternative to SLR.

The TIPS is essentially applied to the semiconductor device manufacturing process due to decreased geometry of the required resist pattern and increased necessity of a short wavelength in a lithography process. However, there are some problems in using TIPS for a high resolution photoresist pattern formation, such as lack of a high photosensitive photoresist and line edge roughness (LER) after dry etching process

SUMMARY OF THE DISCLOSURE

Photoresist compositions are disclosed which are suitable for top-surface imaging process by silylation (TIPS) using a light source such as KrF (248 nm), ArF (193 nm), VUV (157 nm), EUV (13 nm) and E-beam.

Semiconductor elements produced by using the above photoresist composition are also disclosed.

DETAILED DESCRIPTION OF THE PRESENTLY PREFERRED EMBODIMENTS

Figure 1:
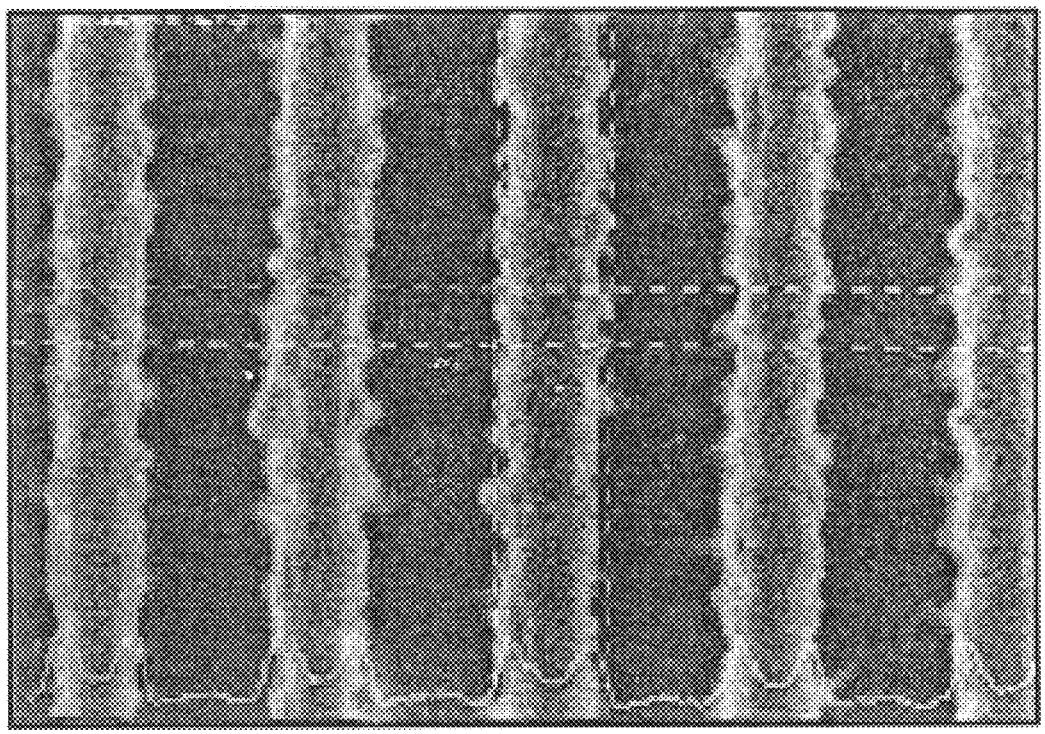
FIG. 1 shows a pattern obtained from Example 6.

Photoresist compositions are disclosed that are suitable for a process for forming a photoresist pattern using top-surface imaging processes by silylation (TIPS).

A photoresist composition for TIPS includes a photoresist polymer, a photoacid generator, an organic solvent and a cross-linker of following Formula 1 or 2:

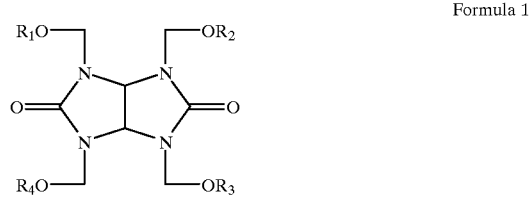

Formula 1 wherein, $R_1$, $R_2$, $R_3$ and P individually represent H, or substituted or unsubstituted linear or branched chain ($C_1$–$C_{10}$) alkyl.

Formula 2

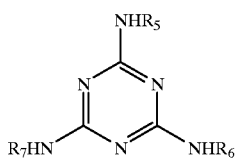

wherein, $R_5$, $R_6$ and $R_7$ individually represent H substituted or unsubstituted linear or branched chain ($C_1$–$C_{10}$) alkyl, or substituted or unsubstituted linear or branched chain ($C_1$–$C_{10}$) alkoxy.

Preferably, the compound of Formula 1 is 1,3,4,6-tetrakis (butoxymethyl)glycoluril, and the compound of Formula 2 is melamine.

The amount of cross-linker is from about 1 to about 20% by weight of the photoresist polymer employed.

In addition, the photoresist polymer of the photoresist composition for the TIPS should have hydroxyl group, and preferably is a polymer of following Formula 3:

Formula 3

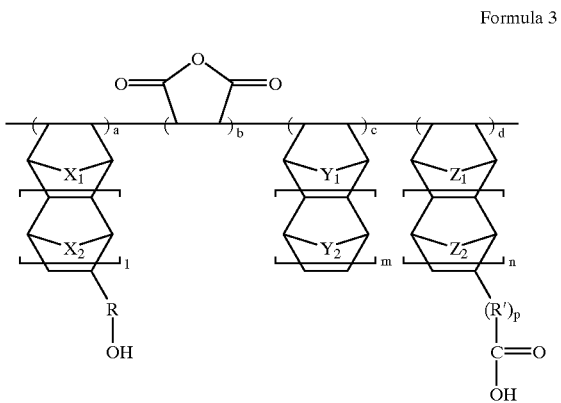

wherein, $X_1$, $X_2$, $Y_1$, $Y_2$, $Z_1$ and $Z_2$ are independently $CH_2$, $CH_2CH_2$, O or S;
R and R' are independently ($C_1$–$C_{10}$) alkylene;
l, m, n and p are independently integers from 0 to 1; and
a mole ratio of a:b:c:d is 0.1–45mol %: 50mol %: 0–45mol %: 0–45mol %.

Exemplary photoresist polymers of Formula 3 are selected from the group consisting of:
poly(bicyclo[2.2.1]hept-5-ene-2-carboxylic acid/ norbornene/maleic anhydride);
poly(bicyclo[2.2.1]hept-5-ene-2-methanol/norbornene/ maleic anhydride);
poly(bicyclo[2.2.1]hept-5-ene-2-methanol/bicyclo[2.2.1] hept-5-ene-2-carboxylic acid/norbornene/maleic anhydride);
poly(bicyclo[2.2.1]hept-5-ene-2-methanol/maleic anhydride); and
poly(bicyclo[2.2.1]hept-5-ene-2-carboxylic acid/maleic anhydride).

The protecting groups of the above cross-linker of Formula 1 or 2 selectively form a cross-linkage with the hydroxyl groups of the photoresist polymer of Formula 3 in the exposed region. And, the photoresist polymer of Formula 3 containing hydroxyl groups which are not cross-linked are, in turn, silylated in the non-exposed region. Accordingly, when the photoresist is etched by using $O_2/SO_2$ gas, the silylated non-exposed region serves as an etching mask, thus forming a positive pattern.

Any known photoacid generator, which is able to generate acid by light, can be used in PR composition of the present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Preferred photoacid generators have a relatively low light absorbency in the wavelengths of 157 nm and 193 nm. More preferably, the photoacid generator is selected from the group consisting of phthalimidotrifluoromethane sulfonate, dinitrobenzyltosylate, n-decyl disulfone, naphthylimido trifluoromethane sulfonate and mixture thereof.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutylnaphthylsulfonium triflate and mixture thereof.

The photoacid generator is used in an amount of 0.1 to 10 wt % of the photoresist resin employed.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Exemplary organic solvents suitable in PR compositions of the present invention include ethyl 3-ethoxypriopionate, methyl 3-methoxypropionate, cyclohexanone, propyleneglycol methyl ether acetate, n-heptanone, ethyl lactate and mixture thereof.

The amount of solvent used is preferably in the range of from about 400% to about 1500% by weight of the PR polymer. This ratio has been found to be particularly useful in obtaining a photoresist layer of a desirable thickness when coated onto a suitable substrate such as a silicon wafer in production of a semiconductor device or element. In particular, it has been found by the present inventors that when the amount of organic solvent is about 1000% by weight of the photoresist polymer, a photoresist composition layer having 0.2$\mu$ m of thickness can be obtained.

A process for forming a photoresist pattern comprising the steps of:
(a) coating a photoresist composition as described herein on a substrate of a semiconductor element to form a photoresist film;
(b) selectively exposing said photoresist film using a light source to produce a selectively exposed photoresist film comprising at least one exposed photoresist portion and at least one unexposed photoresist portion;
(c) applying silylating agent to the resultant to produce a silylated layer on top of the unexposed photoresist portion; and
(d) etching the exposed photoresist portion using the silylated layer as an etching mask.

The wafer is preferably pre-treated with hexamethyl disilazane (HMDS) before step (a). The pre-treatment makes the surface of wafer hydrophobic to improve adhesiveness between the wafer and the photoresist composition.

In the exposure step, a light penetrating through the exposure mask selectively generates a photochemical reaction of the photoresist merely in the exposed region, thus maintaining overlay accuracy with a previously-formed pattern.

The process for forming the photoresist pattern can further include a baking step before and/or after exposure of step (b). Preferably, the baking step is performed at temperature ranging from about 70 to about 200° C. The soft baking step before exposure transforms the photoresist composition into a solid-type resist film by evaporating from about 80 to about 90% of the solvent in the photoresist composition.

A pre-silylation baking (PSB) step is performed after the exposure. The cross-linker is activated due to acid ($H^+$) generated in the exposure step, and thus crosslinked to the photoresist polymer during the PSB step. Accordingly, the hydroxyl group of the photoresist polymer does not exist in the exposed region.

The soft baking step and the PSB step are performed at the temperature in the range of from about 10 to about 200° C.

Exemplary light sources which are useful for forming the PR pattern include ArF, KrF, EUV, VUV, E-beam, X-ray and ion beam. The irradiation energy is preferably in the range of from about 1 to about 3 $mJ/cm^2$.

The silylating agent for the silylation process is selected from the group consisting of hexamethyl disilazane (HMDS), tetramethyl disilazane (TMDS), bis(dimethylamino)dimethylsilane, bis(dimethylamino)methylsilane [B(DMA)MS], dimethylsilyl dimethylamine, dimethylsilyl diethylamine, trimethylsilyl dimethylamine, trimethylsilyl diethylamine, dimethylamino pentamethyldisilane and mixture thereof. The silylating agent can be employed in a liquid phase or, preferably, in a gas phase.

In the silylation process, it is believed that the silylating agent diffuses and penetrates into the photoresist resin. The hydroxyl group present in the photoresist resin reacts with the silylating agent to form a silicon-oxygen dangling bond. When thermal energy or moisture ($H_2O$) is added, the silylating agent diffuses out easily. Therefore the silylation and dry development processes are preferably performed in a single chamber.

On the other hand, the photoresist compositions of the present invention are not limited to be used for the TIPS, but also applied to a general process for forming a photoresist pattern without using the silylation process.

An improved semiconductor element can be manufactured according to the process for forming the pattern using the TIPS as described herein.

The following illustrative examples provide a further disclosure of the (I) photoresist polymer preparation, (II) photoresist composition preparation and (III) pattern formation using TIPS.

I. PREPARATION OF PHOTORESIST POLYMER

PREPARATION EXAMPLE 1

Synthesis of Poly(bicyclo[2.2.1]hept-5-ene-2-carboxylic acid/norbornene/maleic anhydride)

To 70 ml of tetrahydrofuran was added 0.05 M of norbornylene, 0.15 M of bicyclo[2.2.1]hept-5-ene-2-carboxylic acid, 0.2M of maleic anhydride and 0.4 g of AIBN. The resulting solution was reacted at 67° C. for 8 hours. Thereafter, a polymer was precipitated and filtered in petroleum ether/ether (1/1) solution, to obtain the title polymer (yield: 58%).

PREPARATION EXAMPLE 2

Synthesis of Poly(bicyclo[2.2.1]hept-5-ene-2-methanol/norbornene/maleic anhydride)

To 70 ml of tetrahydrofuran was added 0.05 M of norbornylene, 0.15 M of bicyclo[2.2.1]hept-5-ene-2-methanol, 0.2 M of maleic anhydride and 0.4 g of AIBN. The resulting solution was reacted at 67° C. for 8 hours. Thereafter, a polymer was precipitated and filtered in petroleum ether/ether (1/1) solution, to obtain the title polymer (yield: 57%).

PREPARATION EXAMPLE 3

Synthesis of Poly(bicyclo[2.2.1]hept-5-ene-2-methanol/bicyclo[2.2.1]hept-5-ene-2-carboxylic acid/norbornene/maleic anhydride)

To 70 ml of tetrahydrofuran was added 0.04 M of norbornylene, 0.1 M of bicyclo[2.2.1]hept-5-ene-2-methanol, 0.06 M of bicyclo[2.2.1]hept-5-ene-2-carboxylic acid, 0.2 M of maleic anhydride and 0.4 g of AIBN. The resulting solution was reacted at 67° C. for 8 hours. Thereafter, a polymer was precipitated and filtered in petroleum ether/ether (1/1) solution, to obtain the title polymer. Here, the polymer was washed with aqueous $Na_2CO_3$ solution (5%), and re-washed with distilled water to completely remove base. The resulting resin was vacuum-dried to obtain a pure resin (yield: 51%).

PREPARATION EXAMPLE 4

Synthesis of Poly(bicyclo[2.2.1]hept-5-ene-2-methanol/maleic anhydride)

To 70 ml of tetrahydrofuran was added 0.2M of bicyclo[2.2.1]hept-5-ene-2-methanol, 0.2 M of maleic anhydride and 0.4 g of AIBN. The resulting solution was reacted at 67° C. for 8 hours. Thereafter, a polymer was precipitated and filtered in petroleum ether/ether (1/1) solution, to obtain the title polymer. Here, the polymer was washed with aqueous $Na_2CO_3$ solution (5%), and re-washed with distilled water to completely remove base. The resulting resin was vacuum-dried to obtain a pure resin (yield: 68%).

PREPARATION EXAMPLE 5

Synthesis of Poly(bicyclo[2.2.1]hept-5-ene-2-carboxylic acid/maleic anhydride)

To 70 ml of tetrahydrofuran was added 0.2 M of bicyclo[2.2.1]hept-5-ene-2-carboxylic acid, 0.2 M of maleic anhydride and 0.4 g of AIBN. The resulting solution was reacted at 67° C. for 8 hours. Thereafter, a polymer was precipitated and filtered in petroleum ether/ether (1/1) solution, to obtain the title polymer. Here, the polymer was washed with aqueous $Na_2CO_3$ solution (5%), and re-washed with distilled water to completely remove base. The resulting resin was vacuum-dried to obtain a pure resin (yield: 64%).

II. PREPARATION OF PHOTORESIST COMPOSITION

EXAMPLE 1

To 100 g of propylene glycol methyl ethyl acetate (PGMEA) was added 10 g of the polymer prepared in Preparation Example 1, 0.01 g of 1,3,4,6-tetrakis(butoxymethyl)glycoluril, 0.06 g of phthalimido trifluoromethane sulfonate and 0.06 g of triphenylsulfonium triflate. The resulting mixture was filtered through 0.20µ m filter to prepare a photoresist composition.

EXAMPLE 2

To 100 g of PGMEA were added 10 g of the polymer prepared in Preparation Example 2, 0.01 g of 1,3,4,6-tetrakis(butoxymethyl)glycoluril, 0.06 g of phthalimido trifluoromethane sulfonate and 0.06 g of triphenylsulfonium triflate. The resulting mixture was filtered through 0.20µ m filter to prepare a photoresist composition.

EXAMPLE 3

To 100 g of PGMEA were added 10 g of the polymer prepared in Preparation Example 3, 0.01 g of 1,3,4,6-tetrakis (butoxymethyl)glycoluril, 0.06 g of phthalimido trifluoromethane sulfonate and 0.06 g of triphenylsulfonium triflate. The resulting mixture was filtered through 0.20µ m filter to prepare a photoresist composition.

EXAMPLE 4

To 100 g of PGMEA were added 10 g of the polymer prepared in Preparation Example 4, 0.01 g of 1,3,4,6-tetrakis (butoxymethyl)glycoluril, 0.06 g of phthalimido trifluoromethane sulfonate and 0.06 g of triphenylsulfonium triflate. The resulting mixture was filtered through 0.20µ m filter to prepare a photoresist composition.

EXAMPLE 5

To 100 g of PGMEA were added 10 g of the polymer prepared in Preparation Example 5, 0.01 g of 1,3,4,6-tetrakis (butoxymethyl)glycoluril, 0.06 g of phthalimido trifluoromethane sulfonate and 0.06 g of triphenylsulfonium triflate. The resulting mixture was filtered through 0.20µ m filter to prepare a photoresist composition.

II. FORMATION OF PATTERN USING TIPS

EXAMPLE 6

In order to evaluate L/S pattern by the TIPS, the photoresist composition of Example 1 was spin-coated on a bare silicon wafer at a thickness of about 7500 Å, and soft-baked at 100° C. for 60 seconds. After baking, the photoresist was exposed to light by using ISI ArF stepper (NA=0.6, Off-axis). Lam TCP 9400 SE was used for the silylation and dry development processes. The silylation was performed on the exposed photoresist at 100° C. for 210 seconds by using gas-phase tetramethyl disilazane. On the other hand, the dry development included breakthrough for removing a silicon dioxide layer in the exposed region, oxygen plasma etching and over-etching for etching a resist. The dry development was performed under the conditions of 500 W of top power, 100 W of bottom power, 75 W of bias, −30° C., 5 mtorr and 35 sccm $O_2$. In addition, in order to evaluate a silylation contrast, a thickness of the silylation by the irradiation energy was measured in a blank mask state. Here, each photoresist composition was silylated at 100° C. for 210 seconds. The thickness of the silylation was measured by using Prometrix UV-1050. The LER and profile of the thusly-formed pattern were evaluated by using scanning electron microscope (SEM). The formed pattern was 120 nm L/S pattern (see FIG. 1).

EXAMPLES 7–10

The procedure of Example 6 was repeated to obtain 120 nm L/S pattern respectively, but using the photoresist compositions of Examples 2 to 5, instead of using the photoresist composition of Example 1.

As discussed earlier, the disclosed photoresist compositions comprising the cross-linker of Formula 1 or 2 and the copolymer of alicyclic monomer and maleic anhydride are suitable for the TIPS.

Moreover, the pattern formed by using the photoresist composition has excellent contrast ratio, resolution and adhesiveness, thus preventing a pattern collapse in the fine pattern formation.

What is claimed:

1. A photoresist composition for a top-surface imaging process by silylation (TIPS), comprising:
   a photoresist polymer according to Formula 3;

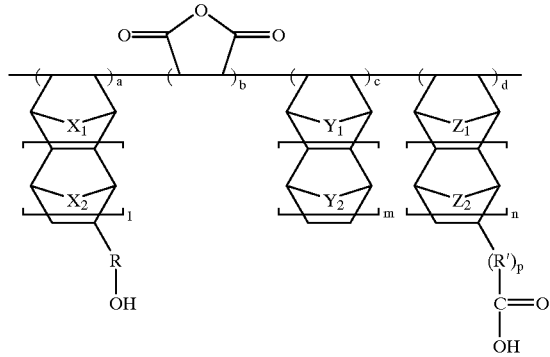

Formula 3 wherein, $X_1$, $X_2$, $Y_1$, $Y_2$, $Z_1$ and $Z_2$ are independently selected from the group consisting of $CH_2$, $CH_2CH_2$, O and S;

R and R' are independently $(C_1–C_{10})$ alkylene;

l, m, n and p are independently integers ranging from 0 to 1; and a mole ratio of a:b:c:d is in the range of 0.1–45 mol %:50 mol %:0–45 mol %:0–45 mol %;

a photoacid generator;

an organic solvent; and a cross-linker selected from the group consisting of following Formulas 1 and 2:

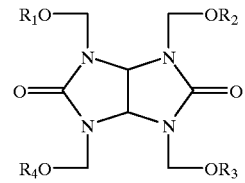

Formula 1 wherein, $R_1$, $R_2$, $R_3$ and $R_4$ individually represent H or $(C_1–C_{10})$ alkyl

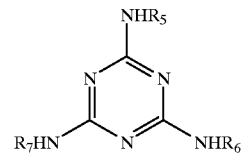

Formula 2 wherein, $R_5$, $R_6$ and $R_7$ are individually selected from the group consisting of H, $(C_1–C_{10})$ alkyl and $(C_1–C_{10})$ alkoxy.

2. The photoresist composition according to claim 1, wherein the cross-linker is a compound of Formula 1 and further is 1,3,4,6-tetrakis(butoxymethyl)glycoluril.

3. The photoresist composition according to claim 1, wherein the cross-linker is a compound of Formula 2 and further is melamine.

4. The photoresist composition according to claim 1, wherein the photoresist polymer of Formula 3 is selected from the group consisting of poly(bicyclo[2.2.1]hept-5-ene-2-methanol/norbornene/maleic anhydride); poly(bicyclo[2.2.1]hept-5-ene-2-methanol/bicyclo[2.2.1]hept-5-ene-2-carboxylic acid/norbornene/maleic anhydride); and poly(bicyclo[2.2.1]hept-5-ene-2-methanol/maleic anhydride).

5. The photoresist composition according to claim 1, wherein an amount of cross-linker ranges from 1 to 20% by weight of the photoresist polymer employed.

6. The photoresist composition according to claim 1, wherein the photoacid generator is selected from the group consisting of phthalimido trifluoromethane sulfonate, dinitrobenzyltosylate, n-decyl disulfone, naphthylimido trifluoromethane sulfonate and mixture thereof.

7. The photoresist composition according to claim 6, wherein the photoacid generator further comprises the compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate and mixture thereof.

8. The photoresist composition according to claim 1, wherein an amount of photoacid generator ranges from 0.1 to 10% by weight of the photoresist polymer employed.

9. The photoresist composition according to claim 1, wherein the organic solvent is selected from the group consisting of ethyl 3-ethoxypropionate, methyl 3-methoxypropionate, cyclohexanone, propylene glycol methyl ether acetate, n-heptanone, ethyl lactate and mixture thereof.

10. The photoresist composition according to claim 1, wherein an amount of organic solvent ranges from 400 to 1500% by weight of the photoresist polymer.

* * * * *